(12) United States Patent
Rancoule

(10) Patent No.: US 7,378,128 B2
(45) Date of Patent: May 27, 2008

(54) CRUCIBLE FOR THE CRYSTALLIZATION OF SILICON

(75) Inventor: Gilbert Rancoule, Marcq-en-Baroeul (FR)

(73) Assignee: Vesuvius Crucible Company, Wilmington, DE (US)

(*) Notice: Subject to any disclaimer, the term of this patent is extended or adjusted under 35 U.S.C. 154(b) by 85 days.

(21) Appl. No.: 11/587,081

(22) PCT Filed: Apr. 26, 2005

(86) PCT No.: PCT/BE2005/000055

§ 371 (c)(1),
(2), (4) Date: Oct. 19, 2006

(87) PCT Pub. No.: WO2005/106084

PCT Pub. Date: Nov. 10, 2005

(65) Prior Publication Data

US 2007/0240635 A1    Oct. 18, 2007

(30) Foreign Application Priority Data

Apr. 29, 2004    (EP) .................................. 04447105

(51) Int. Cl.
*C23C 16/00* (2006.01)
(52) U.S. Cl. ........................ 427/255; 65/33.1; 65/33.4; 117/200
(58) Field of Classification Search .............. 65/26, 65/32.4, 33.1, 33.4, 35.5, DIG. 8; 117/200, 117/900; 427/255, 255.2

See application file for complete search history.

(56) References Cited

U.S. PATENT DOCUMENTS

| 3,660,075 A | 5/1972 | Anderson |
| 3,746,569 A | 7/1973 | Folkmann |
| 4,741,925 A | 5/1988 | Vinod |
| 5,431,869 A | 7/1995 | Kumar |
| 6,841,210 B2* | 1/2005 | Ohama et al. ............. 428/34.4 |

FOREIGN PATENT DOCUMENTS

| DE | 962 868 C | 4/1957 |
| JP | 05 097571 A | 4/1993 |
| JP | 11 209133 A | 8/1999 |
| JP | 2003 041357 A | 6/2003 |

\* cited by examiner

*Primary Examiner*—Felisa C Hiteshew
(74) *Attorney, Agent, or Firm*—Thomas Clinton; Donald M. Satina

(57) ABSTRACT

The invention relates to a crucible for the crystallization of silicon and to the preparation and application of release coatings for crucibles used in the handling of molten materials that are solidified in the crucible and then removed as ingots, and more particularly to release coatings for crucibles used in the solidification of polycrystalline silicon. The objective of the inventor was to provide a crucible which does not require the preparation of a very thick coating at the end user facilities, which is faster and cheaper to produce and which presents a stronger coating with an improved adherence to the walls. It has now been found that these problems can be solved with a crucible for the crystallization of silicon comprising a) a base body comprising a bottom surface and side walls defining an inner volume; b) an intermediate layer comprising 50 to 100 wt. % of silica at the surface of the side walls facing the inner volume; and c) a surface layer comprising 50 to 100 wt. % of silicon nitride, up to 50 wt. % of silicon dioxide and up to 20 wt % of silicon on the top of the intermediate layer.

21 Claims, 1 Drawing Sheet

CRUCIBLE FOR THE CRYSTALLIZATION OF SILICON

FIELD OF THE INVENTION

The invention relates to a crucible for the crystallization of silicon and to the preparation and application of release coatings for crucibles used in the handling of molten materials that are solidified in the crucible and then removed as ingots, and more particularly to release coatings for crucibles used in the solidification of polycrystalline silicon.

BACKGROUND OF THE INVENTION

Crucibles of silica (either of fused-silica or of quartz) are typically used in solidification of polycrystalline silicon. Silica is chosen primarily for high-purity and availability. There are problems in using silica, however, as a crucible for the production of silicon by this method.

Silicon in its molten state will react with the silica crucible that is in contact with it. Molten silicon reacts with silica to form silicon monoxide and oxygen. Oxygen will contaminate the silicon. Silicon monoxide is volatile, and will react with the graphite components inside the furnace. Silicon monoxide reacts with graphite to form silicon carbide and carbon monoxide. The carbon monoxide will then react with the molten silicon, forming additional volatile silicon monoxide and carbon. Carbon will contaminate the silicon. Silicon can also react with the various impurities contained in the silica crucible (iron, boron, aluminum, . . . ).

The reaction between silica and silicon promotes adhesion of the silicon to the crucible. This adhesion, combined with a difference in coefficients of thermal expansion between the two materials, creates stress in the silicon ingot, causing it to crack on cooling. It is known in the art that a release coating applied to the inside of the crucible in the area of contact with the ingot can prevent the reaction between silicon and silica that leads to ingot contamination and cracking. To be effective, the release coating must be thick enough to prevent the silicon from reacting with the silica crucible, and must not adversely contaminate the silicon either by itself or from contaminants within it.

A variety of materials and techniques are described in the literature, which attempt to solve the problem of reaction and adhesion of the crucible in contact with molten material. For example U.S. Pat. No. 5,431,869 describes a multi-component release agent of silicon nitride and calcium chloride for silicon processing using a graphite crucible.

U.S. Pat. No. 4,741,925 describes a silicon nitride coating for crucibles applied by chemical vapor deposition at 1250° C. while WO-A1-2004/053207 discloses a silicon nitride coating applied by plasma spraying. U.S. Pat. No. 3,746,569 discloses the pyrolysis formation of a silicon nitride coating on the walls of a quartz tube. U.S. Pat. No. 4,218,418 describes a technique of forming a glass layer inside a silica crucible by rapid heating to prevent cracking of silicon during melt-processing. U.S. Pat. No. 3,660,075 discloses a coating of niobium carbide or yttrium oxide on a graphite crucible for melting fissile materials. The niobium carbide is applied by chemical vapor deposition, while the yttrium oxide is applied as a colloidal suspension in an aqueous inorganic solution.

Prior art references include specific references to powdered mold release agents for application to crucibles in the directional solidification of silicon. In addition, the use of chemical vapor deposition, solvent evaporation, high-temperature flame treatment, and other expensive and complex means are mentioned for application of crucible coatings. References are made to specific binders and solvents. References are made to mixing, spraying, or brushing for slurries of powdered coatings.

This silicon nitride release coating itself can lead to problems. The thickness of the silicon nitride coating necessary to prevent the silicon from reacting with the silica crucible is quite important (about 300 μm) making thereby the coating operation expensive and time consuming. Further, this silicon nitride coating is mechanically weak and can peel or flake off during or even before use. It is therefore recommended to apply this coating at the very last moment before use, i.e., at the end user facilities, leaving thereby the burden of applying this thick coating to the end user.

It would therefore be desirable to provide a silica crucible which does not present the above problems (i.e. which does not require the preparation of a very thick coating at the end user facilities, which is faster and cheaper to produce and which presents a stronger coating with an improved adherence to the walls).

SUMMARY OF THE INVENTION

It has now been found that these problems can be solved with a crucible for the crystallization of silicon comprising a) a base body comprising a bottom surface and side walls defining an inner volume; b) an intermediate layer comprising 50 to 100 wt. % of silica at the surface of the side walls facing the inner volume; and c) a surface layer comprising 50 to 100 wt. % silicon nitride, up to 50 wt. % of silicon dioxide and up to 20 wt. % of silicon on the top of the intermediate layer.

Indeed, the intermediate layer comprising 50 to 100 wt. % of silica at the surface of the side walls is extremely resistant and easy to manufacture. Since there is no problem of peeling or flaking off with this intermediate layer, it can be prepared before reaching the end user facilities so that the end user only needs to provide a thin surface layer which is faster and cheaper to coat. Moreover, it has been surprisingly discovered that this intermediate layer tremendously increases the adhesion of the surface layer.

According to an advantageous embodiment of the invention, the strength of the intermediate layer is voluntarily limited so that the adhesion of the intermediate layer to the surface layer and/or the base body is lower than the adhesion of the surface layer to a silicon ingot. Consequently, during the crystallization of the silicon ingot—if for any reason—the silicon ingot adheres to the surface layer, the intermediate layer will delaminate under the effect of the stress generated by the cooling of the ingot. Thereby, only the coating of the crucible is destroyed, leaving the silicon ingot in perfect shape. One way of limiting the strength of the intermediate layer, is to act on the porosity of said layer. The porosity can be determined by the granulometry of the particles included in the layer (a majority of large particles will result in a high porosity). Another possibility is to include in the composition a material that will confer or generate the required porosity. For example, the use of alumina microbubbles (FILLITE) of silico-aluminate fibers will confer the required porosity. Carbonaceous materials such as resins or carbon which will pyrolyse without residue but with the production of fine carbon dioxide bubbles during firing will generate the required porosity as well.

Another advantage of this coating is that it can be applied on various crucible materials so that the end user which receives a crucible with a silica containing intermediate layer does not need to develop particular and different procedures to coat various materials. The intermediate layer can be applied on quartz, fused silica, silicon nitride, SiALON, silicon carbide, alumina or even graphite crucibles.

Advantageously, the intermediate layer has a thickness of 50 to 300μm so as to provide the majority of the thickness necessary to prevent reaction of the silicon with the crucible, and contamination of the silicon from contaminants within it.

Beside the silica, the intermediate layer can comprise any material which, after firing, will be stable and will not react with silicon. Alumina or silico-aluminate materials are particularly suitable. Carbonaceous materials that will pyrolyse during firing can also be used for certain applications.

The intermediate layer can comprise a non-organic (such as colloidal silica) and/or organic (such as an organic resin like polyethylene glycol, polyvinyl alcohol, polycarbonate, epoxy, carboxymethylcellulose) binder. The amount of the organic and non organic binder incorporated into the composition depends upon the application requirements (strength of the unfired coating, etc.). Typically, the coating comprises from 5 to 20 wt. % of non-organic binder and up to 5 wt. % of organic binder. Usually, the intermediate layer is applied in water or in solvent by spraying or brushing. Preferably by spraying in a water based system comprising an appropriate amount of water to permit the suspension of the whole composition.

According to a particular embodiment of the invention, the crucible comprises a further layer (a second intermediate layer) on the top of the intermediate layer. This further layer comprises up to 50% by weight of silicon nitride, the remainder consisting essentially of silico dioxide. This further layer improves the compatibility between the surface layer and the first intermediate layer and strongly improves its adhesion. When present, this further layer will have a thickness of up to 200 μm, preferably of 50 to 100 μm.

Depending upon the application, the surface layer will have a thickness of 50 μm to 500 μm, preferably of 200 to 500 μm. To avoid any contamination, it is essential that the surface layer be of very high purity with a ultra-low carbon content. Typically, the surface layer will comprise 50 to 100 wt. % of $Si_3N_4$, up to 50 wt. % of $SiO_2$ and up to 20 wt. % of silicon. Usually, the surface layer will be applied by spraying or brushing, preferably by spraying. In a preferred embodiment of the process according to the invention, the step of applying the coating is followed by a heating step at a temperature and for a duration appropriate to calcinate substantially all the organic compound present in the coatings. It can be noted that when an intermediate layer according to the invention is used, the thickness of the surface layer can be largely reduced without impairing the properties of the coating (adhesion properties).

DETAILED DESCRIPTION OF THE INVENTION

Figure 1:
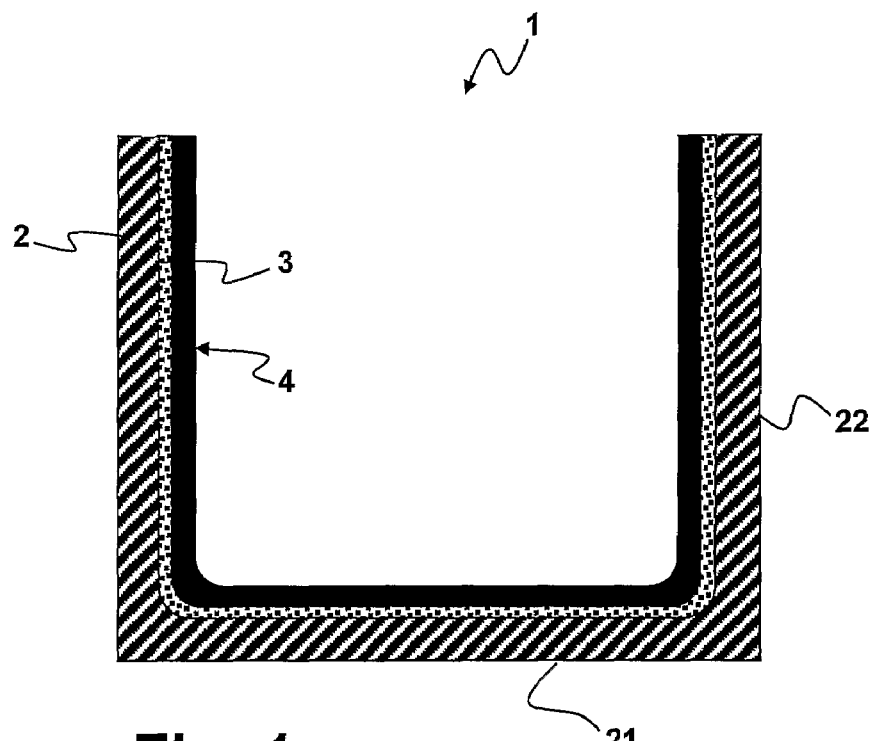
FIG. 1 is a cross section of a crucible of the invention with an intermediate layer.

The invention will now be described with reference to the enclosed figures which only serve to illustrate the invention and are not intended to limit its scope. Both FIGS. 1 and 2 show cross-sections of crucibles according to the invention.

On these figures, the crucible is designated with reference number 1. It comprises a base body 2 comprising a bottom surface 21 and side walls 22 which define an inner volume for the crystallization of silicon. The crucible comprises an intermediate layer 3 which is comprised of up to 100 wt. % of silica at the surface of the side walls 22 facing the inner volume.

Figure 2:
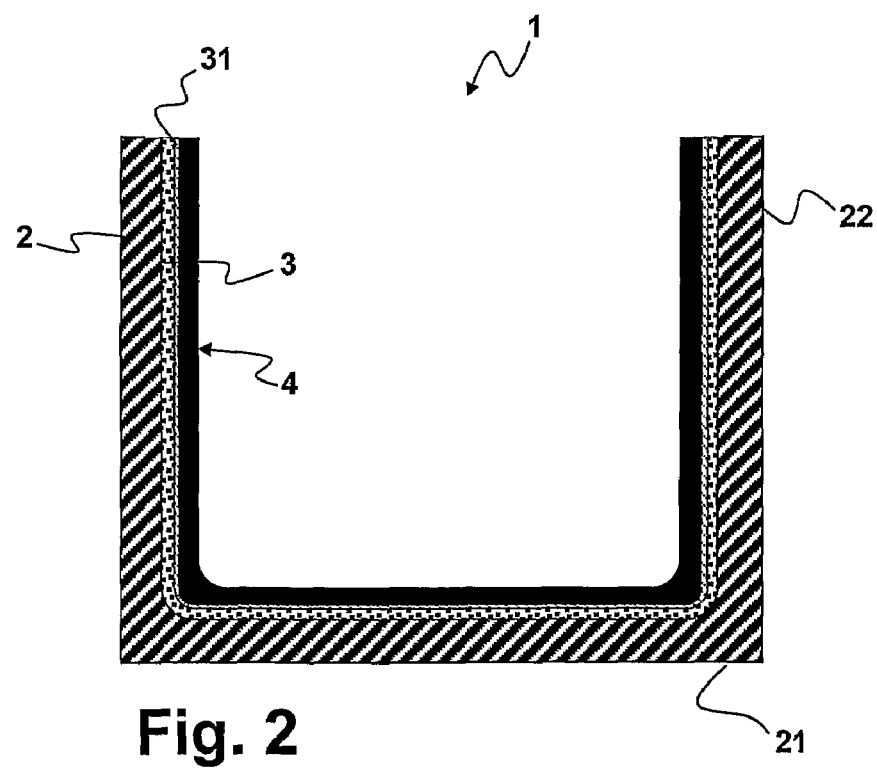
FIG. 2 is a cross section of the crucible of the invention with a further intermediate layer.

On FIG. 2, the crucible comprises a further intermediate layer 31 comprising up to 50 wt. % of $Si_3N_4$, the remainder consisting essentially of $SiO_2$. Such a further intermediate coating is not present on FIG. 1. On both figures, the crucible 1 further comprises a surface layer 4 comprising $Si_3N_4$.

The invention will now be illustrated by way of examples according to the invention and comparative examples. In the following tables, the adhesion of the various coatings has been determined in accordance with ASTM D4541 using a POSITEST PULL-OFF ADHESION TESTER (from the firm DEFELSKO Corp.). This tester evaluates the adhesion of the coating by determining the greatest tensile pull off force that it can bear before detaching. I.e., the force required to pull a specified test diameter of coating away from its substrate using hydraulic pressure. The force is expressed in term of pressure (kPa).

Examples of intermediate layers:

TABLE I

| | Intermediate layer | | | | | | |
|---|---|---|---|---|---|---|---|
| | A | B | C | D | E | F | G |
| Colloidal silica** | | | | 25 | 30 | 30 | 15 |
| Fume silica (≈1 μm)** | | 20 | 20 | 10 | | 10 | 20 |
| Silica grains (10-20 μm)** | 100 | 40 | 40 | | 6 | 10 | 65 |
| Silica grains (20-44 μm)** | | | 20 | 65 | 60 | 60 | |
| Silica grains (45-100 μm)** | | 40 | 20 | | 4 | | |
| Deionized water** | | +50 | | +50 | | | |
| Deionized water + Binder** (PVA 10 wt. %)) | +70 | | +66 | | +50 | +45 | +60 |
| Thickness of the layer (μm) | 300 | 500 | 500 | 150 | 500 | 250 | 200 |
| Roughness (μm) | 5 | 8 | 12 | ≈5 | ≈15 | ≈10 | 5 |
| Adhesion (kPa) | 1103 | 345 | 827 | 827 | 1241 | 1379 | 1103 |

**(wt. %)

The preferred examples are those of compositions C and G, G being the most preferred.

Examples of further intermediate layer:

TABLE II

| | Further intermediate layer | | |
|---|---|---|---|
| | IA | IB | IC |
| Fume silica (≈1 μm)** | | | 20 |
| Silica grains (10-20 μm)** | | 60 | 40 |
| Silica grains (20-44 μm)** | 60 | | |
| Deionized water** | +60 | | |

TABLE II-continued

| Further intermediate layer | | | |
|---|---|---|---|
| | IA | IB | IC |
| Deionized water + Binder** (PVA 10 wt. %)) | | +70 | +80 |
| Silicon nitride powder** | 40 | 40 | 40 |
| Thickness of the layer (μm) | 50 | 75 | 100 |
| Roughness (μm) | 10 | 8 | 5 |

**(wt. %)

The preferred composition is the one of example IB.

Examples of surface layer:

TABLE III

| Surface layer | | | | |
|---|---|---|---|---|
| | SA | SB | SC | SD |
| Colloidal silica** | | | | 5 |
| Silica grains (10-20 μm)** | | | 5 | |
| Deionized water** | +55 | | | |
| Deionized water + Binder** (PVA 10 wt. %) | | +70 | | +65 |
| Silicon nitride powder** | 100 | 100 | 80 | 85 |
| Si** | | | 15 | 10 |
| Thickness of the layer (μm) | 100 | 200 | 200 | 300 |
| Roughness (μm) | 5 | 5 | ≈5 | 5 |
| Adhesion*** (kPa) | 241 | 827 | 965 | 827 |

**(wt. %)
***with a substrate corresponding to intermediate layer G

Preferred compositions are SA and SB, the most preferred composition being SB.

Examples of crucible:

TABLE IV

| Crucible | | | | | | |
|---|---|---|---|---|---|---|
| | 1 | 2 | 3 | 4 | 5* | 6* |
| Intermediate layer | A | B | C | D | — | — |
| Further intermediate layer | IA | — | IC | — | — | — |
| Surface coating | SA | SB | SC | SD | SB | SD |
| Adhesion of the surface coating | Good | Excellent | Excellent | Good | Poor | Poor |

*Comparative example.

It is to be noted that the thickness of the surface layers SB and SD was doubled in examples 5 and 6.

The invention claimed is:

1. Process for the preparation of a crucible for the crystallization of silicon comprising:
   a) providing a base body comprising a bottom surface and side walls, the bottom surface and side walls defining an inner volume, each side wall having a side wall surface facing the inner volume;
   b) applying an intermediate layer comprising 50 to 100 wt. % of silica on the side wall surfaces, thereby forming an intermediate surface; and
   c) applying a surface layer comprising 50 to 100 wt. % silicon nitride, up to 50 wt. % silicon dioxide and up to 20 wt. % silicon on the intermediate layer surface.

2. Process of claim 1, further comprising applying a second intermediate layer between the intermediate layer and the surface layer, the second intermediate layer comprising silicon dioxide and up to 50 wt. % silicon nitride.

3. Process of claim 1, wherein the intermediate layer is applied by spraying.

4. Process of claim 1, wherein the surface layer is applied by spraying.

5. Process of claim 1, further comprising heating the coated crucible at a temperature and for a duration appropriate to calcinate substantially all the organic compound present.

6. Crucible for the crystallization of silicon comprising:
   a) a base body comprising a bottom surface and side walls, the bottom surface and side walls defining an inner volume, each side wall having a side wall surface facing the inner volume;
   b) an intermediate layer covering at least a portion of the side wall surface, the intermediate layer comprising 50 to 100 wt. % of silica and having an intermediate surface facing the inner volume; and
   c) a surface layer covering at least a portion of the intermediate surface, the surface layer comprising 50 to 100 wt. % silicon nitride, up to 50 wt. % silicon dioxide and up to 20 wt. % of silicon.

7. Crucible of claim 6, wherein the intermediate layer includes a thickness between 50 μm and 500 μm.

8. Crucible of claim 7, wherein the intermediate layer includes a thickness between 200 μm to 500 μm.

9. Crucible of claim 6, wherein the intermediate layer comprises a non-organic binder.

10. Crucible of claim 9, wherein the intermediate layer comprises colloidal silica.

11. Crucible of claim 9, wherein the intermediate layer comprises from 5 to 20 wt. % non-organic binder.

12. Crucible of claim 6, wherein the intermediate layer comprises an organic binder.

13. Crucible of claim 12, wherein the organic binder is selected from a group consisting of polyethylene glycol, polyvinyl alcohol, polycarbonate, epoxy, and carboxymethylcellulose.

14. Crucible of claim 12, wherein the intermediate layer comprises up to 5 wt. % organic binder.

15. Crucible of claim 6, wherein the crucible comprises a second intermediate layer between the intermediate layer and the surface layer, the second intermediate layer comprising silicon dioxide and up to 50 wt. % of silicon nitride.

16. Crucible of claim 15, wherein the second intermediate layer includes a thickness of up to 200 μm.

17. Crucible of claim 16, wherein the thickness of the second intermediate layer is from 50 μm to 100 μm.

18. Crucible of claim 6, wherein the surface layer includes a thickness between 50 μm to 500 μm.

19. Crucible of claim 6, wherein the surface layer includes a thickness from 200 μm to 500 μm.

20. Crucible of claim 6, wherein the surface layer comprises 50 to 100 wt. % silicon nitride, up to 40 wt. % silica, and up to 10 wt. % silicon.

21. Crucible for the crystallization of silicon comprising:
   a) a base body comprising a bottom surface and side walls, the bottom surface and side walls defining an inner volume, each side wall having a side wall surface facing the inner volume;

b) a first intermediate layer covering at least a portion of the side wall surface, the intermediate layer comprising 50 to 100 wt. % of silica and including a thickness between 50 μm and 500 μm, the intermediate layer having a first intermediate surface facing the inner volume;

c) a second intermediate layer covering at least a portion of the intermediate surface, the second intermediate layer comprising silicon dioxide and up to 50 wt. % of silicon nitride, and having a thickness of up to 200 μm, the second intermediate layer having a second intermediate surface facing the inner volume; and d) a surface layer at least partially covering the second intermediate surface, the surface layer comprising 50 to 100 wt. % silicon nitride, up to 50 wt. % silicon 11 dioxide and up to 20 wt. % of silicon, the surface layer including a thickness between 50 μm to 500 μm.

* * * * *